United States Patent [19]

Dinan

[11] Patent Number: 6,037,790
[45] Date of Patent: Mar. 14, 2000

[54] IN-SITU CONTACT RESISTANCE MEASUREMENT FOR ELECTROPROCESSING

[75] Inventor: Thomas Edward Dinan, Danbury, Conn.

[73] Assignee: International Business Machines Corporation, Armonk, N.Y.

[21] Appl. No.: 08/807,478

[22] Filed: Feb. 25, 1997

[51] Int. Cl.[7] .......................... G01R 31/02; G01R 27/08
[52] U.S. Cl. ............................. 324/757; 324/691
[58] Field of Search .................... 324/757, 691, 324/715, 719

[56] References Cited

U.S. PATENT DOCUMENTS

| | | | |
|---|---|---|---|
| 3,928,795 | 12/1975 | Lechner | 324/28 CR |
| 4,232,262 | 11/1980 | Emo et al. | 324/722 |
| 4,342,957 | 8/1982 | Russell | 324/73 R |
| 4,342,958 | 8/1982 | Russell | 324/73 R |
| 4,578,637 | 3/1986 | Allen et al. | 324/73 |
| 5,202,639 | 4/1993 | McKeon et al. | 324/537 |
| 5,369,358 | 11/1994 | Metzger et al. | 324/754 |
| 5,444,390 | 8/1995 | Bartlett et al. | 324/770 |
| 5,485,095 | 1/1996 | Bertsch et al. | 324/537 |

FOREIGN PATENT DOCUMENTS 5-281297 10/1993 Japan.

OTHER PUBLICATIONS

IBM Technical Disclosure Bulletin vol. 25 No. 12 May 1983; "Testing Tester Relays Within A Tester", R.D. Burke and PC. Reichert.

*Primary Examiner*—Josie Ballato
*Assistant Examiner*—Russell M. Kobert
*Attorney, Agent, or Firm*—Alison D. Mortinger; Jay H. Anderson

[57] ABSTRACT

In-situ identification of faulty electrical contacts in an electroprocessing fixture involves measuring resistance of contact pairs while the workpiece is mounted in the fixture, and calculating a resistance of an individual contact from the contact pair resistances. The individual contact resistances are compared with a maximum allowable resistance, and any contact having an individual resistance exceeding the maximum allowable resistance is identified as faulty. Faulty contacts are reseated, and then remeasured. The remeasuring can be of a subset of the whole set of contacts in the fixture.

23 Claims, 1 Drawing Sheet

IN-SITU CONTACT RESISTANCE MEASUREMENT FOR ELECTROPROCESSING

FIELD OF THE INVENTION

This invention is directed to electroprocessing (etching or plating) a workpiece, and more particularly to diagnosis of a faulty contact in the electroprocessing fixture.

BACKGROUND OF THE INVENTION

Typically, in electroetching or electroplating a fixture is used to hold a workpiece such as a semiconductor wafer in a bath. The fixture is connected to a power source, and contacts the workpiece to make it either the cathode or anode, depending on whether etching or plating is desired.

Depending on the size and shape of the workpiece, there will be several to many electrical contacts to the workpiece. The failure of just one contact can result in a defective workpiece, as the workpiece will not be properly charged across the entire surface for processing. In the case of semiconductor processing, the loss of just one wafer can be very expensive, depending on how much processing has been completed.

The testing of contacts is tedious and often impractical, and requires disconnection and disassembly of the fixture to isolate individual contacts for contact resistance measurement. Thus, there remains a need for electroprocessing contact testing without fixture disassembly, and preferably one that can be performed in-situ (while the fixture contains a workpiece). Therefore any contact failures could be immediately identified and corrected before scrapping any workpieces.

SUMMARY OF THE INVENTION

It is therefore an object of the present invention to provide electroprocessing contact testing without fixture disassembly.

It is a further object to provide in-situ testing of each contact for each electroprocessed part.

In accordance with the above listed and other objects, in-situ identification of faulty electrical contacts in an electroprocessing fixture involves measuring resistance of contact pairs while the workpiece is mounted in the fixture, and calculating a resistance of an individual contact from the contact pair resistances. The individual contact resistances are compared with a maximum allowable resistance, and any contact having an individual resistance exceeding the maximum allowable resistance is identified as faulty. Faulty contacts are reseated, and then remeasured. The remeasuring can be of a subset of the whole set of contacts in the fixture.

BRIEF DESCRIPTION OF THE DRAWINGS

These and other features, aspects, and advantages will be more readily apparent and better understood from the following detailed description of the invention, in which.

DESCRIPTION OF THE PREFERRED EMBODIMENTS

Figure 1:
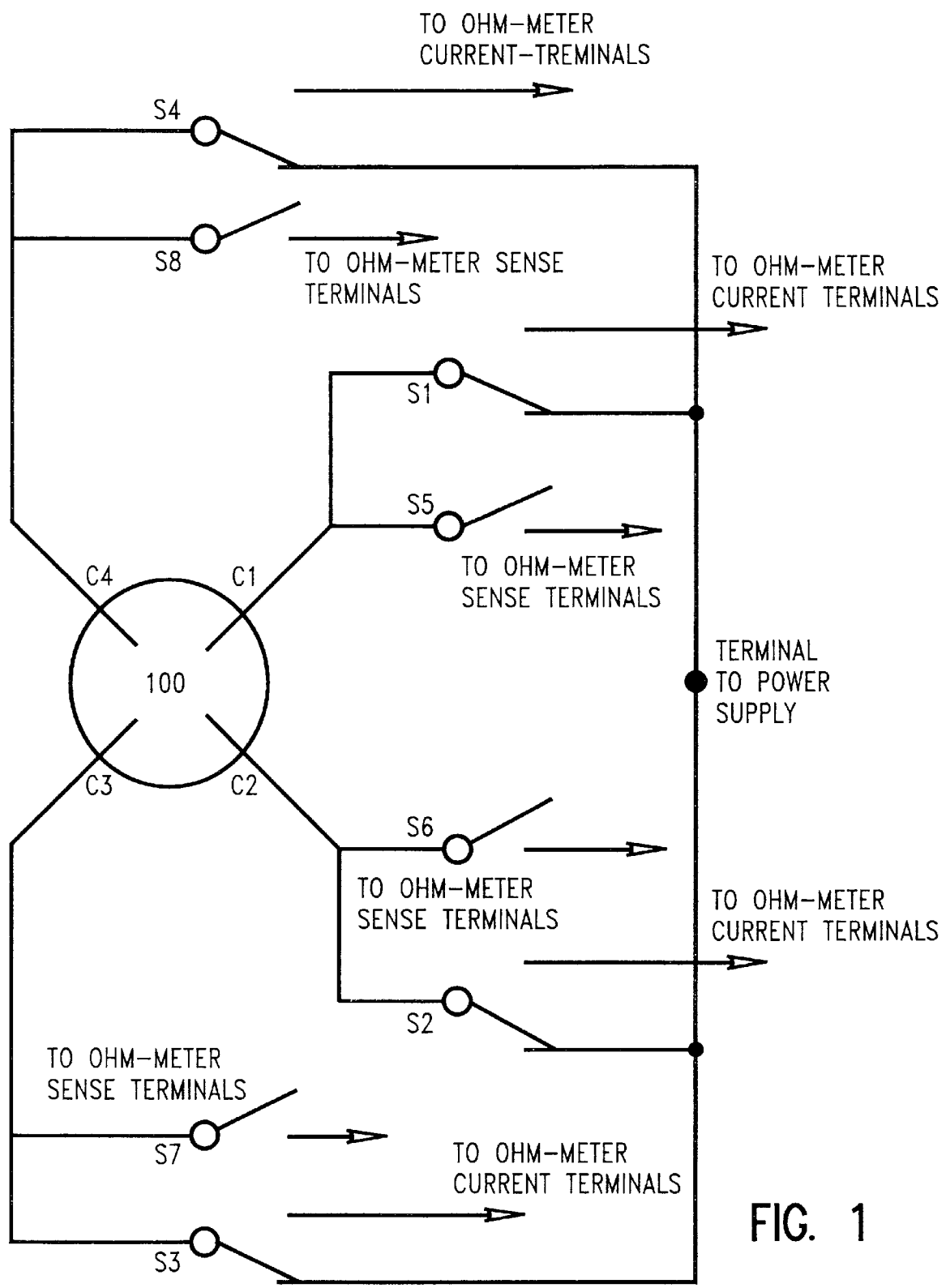
FIG. 1 shows the fixture contacts and isolation relays, in accordance with the present invention.

The present invention is described herein in the context of wafer processing merely as a specific example, and is not meant to limit applicability of the invention to semiconductor technology. Those skilled in the art will understand that the invention is broadly applicable to any electroetching or electroplating process in which it is desirable to have in-situ identification of faulty electrical contacts in an electroprocessing fixture.

Referring now to the drawings and more particularly to FIG. 1, the electroprocessing fixture contacts and isolation relays are shown. Conductive or semiconductive workpiece 100, for example a semiconductor wafer, is contacted by contacts C1, C2, C3, and C4. The resistance of each contact with respect to the workpiece is given by R(C1), R(C2), R(C3), R(C4). Note that although four contacts are shown, the invention is compatible with any number of contacts greater than two. Contact C1 is connected to a power supply circuit via relay S1, and is also connected to a resistance measurement circuit via relay S5. Likewise, relays S2, S3, and S4 connect contacts C2, C3, and C4 respectively to the power supply circuit, and relays S6, S7, and S8 connect contacts C2, C3, and C4 respectively to the resistance measurement circuit. Note that relays which carry plating or etching current are preferably mechanical rather than solid state. As illustrated in FIG. 1, these would be relays S1, S2, S3, and S4.

More specifically, S1, S2, S3, and S4 can be switched from the power supply to a set of ohmmeter current terminals, and S5, S6, S7, and S8 will connect to a set of ohmmeter sense terminals. A personal computer (not shown) with data acquisition and analog output boards controls the testing, and isolates a pair of contacts by switching the appropriate relays. The ohmmeter measures the resistance of the pair and the result is stored in the computer. In this manner, all potential contact pair resistances are measured and stored.

The resistance R(I) of an individual contact I is then calculated by the computer from the stored pair resistances according to the formula $$R(I)=(R(I,J)+R(I,K)-R(J,K))*0.5$$

where

R(I,J) is the resistance of contact pair I,J and

J and K are other contacts in the fixture.

For example, the resistance of contact C1 may be calculated as follows:

$$R(C1)=(R(C1,C2)+R(C1,C3)-R(C2,C3))*0.5$$

Once the individual contact resistances are calculated, each is compared with an empirically determined maximum allowed resistance. If the individual contact resistance exceeds the maximum, then the contact is identified as faulty. Using the above example for contact C1, if C1 is faulty, both R(C1,C2) and R(C1,C3) will be large and the maximum will be exceeded. If C2 or C3 is faulty and C1 is good, R(C2,C3) will be large and the maximum will not be exceeded.

Once a contact has been identified as faulty, the faulty contact is reseated in attempt to fix the problem. The reseating can be done either manually or robotically. The resistance of the faulty contact is then remeasured to see if the reseating was successful. All the contact pairs can be remeasured an recalculated, or alternately a subset can be remeasured, which can save time if the fixture contains a large number of contacts. The subset can consist of three contact pair measurements—for example R(C1,C2), R(C1, C3), and R(C2,C3) if C1 is identified as faulty. Another approach is to have the computer choose a contact known to be good and simply measure one contact pair resistance and then calculate the resistance R(Cf) of the faulty contact F using the formula $$R(Cf)=R(Cf,Cg)-R(Cg)$$

where

R(Cg) is the resistance of known good contact G, and

R(Cf,Cg) is the resistance of contact pair F,G.

The individual resistances are again compared to the maximum allowed resistance, and again identified as faulty if the maximum is exceeded.

If a contact is twice identified to be faulty, then the reseating was unsuccessful. At this point, in-situ correction of a faulty contact is no longer possible, the workpiece is removed from the fixture, and other sources of the problem are examined and corrected, for example a faulty contact to the workpiece not able to be fixed by reseating, faulty wiring between the contact pin and the power supply, or a defective workpiece.

In summary, the invention as described allows in-situ contact resistance testing of each contact for each electroprocessed part, which enables immediate fault identification, and avoidance of production of defective workpieces.

While the invention has been described in terms of specific embodiments, it is evident in view of the foregoing description that numerous alternatives, modifications and variations will be apparent to those skilled in the art. Thus, the invention is intended to encompass all such alternatives, modifications and variations which fall within the scope and spirit of the invention and the appended claims.

What is claimed is:

1. A method for in-situ identification of faulty electrical contacts in an electroprocessing fixture containing an at least semiconductive workpiece with at least three contacts connected thereto, comprising:

measuring a resistance between a first member and a second member of each of at least three distinct pairs of said contacts while the workpiece is mounted in the fixture to obtain a contact pair resistance for each of said pairs, each contact pair resistance being the sum of a resistance of the first member of the pair with respect to the workpiece and a resistance of the second member of the pair with respect to the workpiece;

calculating a resistance of an individual contact with respect to the workpiece from the contact pair resistances;

comparing the individual contact resistance with a maximum allowable resistance; and identifying as faulty a contact having an individual resistance exceeding the maximum allowable resistance.

2. The method of claim 1, wherein the measuring step comprises:

connecting the contacts to a measuring device through relays;

switching the relays to isolate each contact pair to be measured; and measuring a resistance of each isolated contact pair.

3. The method of claim 2 wherein the measuring device is an ohmmeter.

4. The method of claim 1 wherein the resistance R(I) of an individual contact I is calculated according to the formula $$R(I)=(R(I,J)+R(I,K)-R(J,K))*0.5$$

where

R(I,J) is the resistance of contact pair I,J and

J and K are other contacts in the fixture.

5. The method of claim 1 further comprising reseating any faulty contact.

6. The method of claim 5 wherein the reseating is done manually.

7. The method of claim 5 wherein the reseating is done automatically.

8. The method of claim 5, further comprising:

remeasuring, recalculating, and recomparing the individual contact resistance; and if the individual contact resistance for the faulty contact exceeds the maximum allowable resistance, then identifying the faulty contact as twice-faulty.

9. The method of claim 8 wherein the remeasuring and recalculating steps are performed for all possible contact pairs.

10. The method of claim 8, wherein the remeasuring and recalculating steps comprise for each faulty contact:

selecting a good contact;

measuring a contact pair resistance between the faulty contact and the good contact; and calculating a resistance for the faulty contact from the measured contact pair resistance between the faulty contact and the good contact.

11. The method of claim 10 wherein the contact resistance R(Cf) for the faulty contact F is calculated according to the formula $$R(Cf)=R(Cf,Cg)-R(Cg)$$

where

R(Cg) is the resistance of known good contact G and

R(Cf,Cg) is the resistance of contact pair F,G.

12. The method of claim 8, wherein the remeasuring and recalculating steps comprise for each faulty contact:

selecting two contacts other than the faulty contact;

measuring contact pair resistances for the faulty contact and the two selected contacts; and calculating a resistance of the faulty contact from the measured contact pair resistances for the faulty contact and the two selected contacts.

13. The method of claim 8 wherein any contact has been identified as twice-faulty, further comprising removing the workpiece from the fixture and repairing the cause of the twice-faulty contact.

14. An apparatus for in-situ identification of faulty electrical contacts in an electroprocessing fixture containing an at least semiconductive workpiece with at least three contacts connected thereto, comprising:

means for measuring a resistance between a first member and a second member of each of at least three distinct pairs of said contacts while the workpiece is mounted in the fixture to obtain a contact pair resistance for each of said pairs, each contact pair resistance being the sum of a resistance of the first member of the pair with respect to the workpiece and a resistance of the second member of the pair with respect to the workpiece;

means for calculating a resistance of an individual contact with respect to the workpiece from the contact pair resistances;

means for comparing the individual contact resistance with a maximum allowable resistance; and means for identifying as faulty a contact having an individual resistance exceeding the maximum allowable resistance.

15. The apparatus of claim 14, wherein the measuring means comprises:

means for connecting the contacts to a measuring device through relays;

means for switching the relays to isolate each contact pair to be measured; and means for measuring a resistance of each isolated contact pair.

16. The apparatus of claim 15 wherein the measuring device is an ohmmeter.

17. The apparatus of claim 14 wherein the resistance $R(I)$ of an individual contact I is calculated according to the formula $$R(I)=(R(I,J)+R(I,K)-R(J,K))*0.5$$

where $R(I,J)$ is the resistance of contact pair I,J and

J and K are other contacts in the fixture.

18. The apparatus of claim 14, further comprising means for reseating any faulty contact.

19. The apparatus of claim 18 wherein the reseating is done automatically.

20. The apparatus of claim 18, further comprising:

means for remeasuring, recalculating, and recomparing the individual contact resistance; and means for identifying the faulty contact as twice-faulty if the individual contact resistance for the faulty contact exceeds the maximum allowable resistance.

21. The apparatus of claim 20, wherein the remeasuring and recalculating means further comprise:

means for selecting a good contact;

means for measuring a contact pair resistance between the faulty contact and the good contact; and means for calculating a resistance for the faulty contact from the measured contact pair resistance between the faulty contact and the good contact.

22. The apparatus of claim 21 wherein the contact resistance $R(Cf)$ for the faulty contact F is calculated according to the formula $$R(Cf)=R(Cf,Cg)-R(Cg)$$

where $R(Cg)$ is the resistance of known good contact G and $R(Cf,Cg)$ is the resistance of contact pair F,G.

23. The apparatus of claim 20, wherein the remeasuring and recalculating means further comprise:

means for selecting two contacts other than the faulty contact;

means for measuring contact pair resistances for the faulty contact and the two selected contacts; and means for calculating a resistance of the faulty contact from the measured contact pair resistances for the faulty contact and the two selected contacts.

* * * * *